(12) United States Patent
Yamaguchi et al.

(10) Patent No.: US 6,319,597 B1
(45) Date of Patent: Nov. 20, 2001

(54) POLYIMIDE COMPOSITE FILM

(75) Inventors: Hiroaki Yamaguchi; Fumio Aoki; Shuichi Hirano, all of Chiba (JP)

(73) Assignee: Ube Industries, Ltd., Yamaguchi (JP)

( * ) Notice: Subject to any disclaimer, the term of this patent is extended or adjusted under 35 U.S.C. 154(b) by 0 days.

(21) Appl. No.: 09/309,222

(22) Filed: May 10, 1999

(51) Int. Cl.⁷ .............................. B32B 7/02; B32B 15/08; B32B 27/08
(52) U.S. Cl. .................... 428/216; 428/215; 428/458; 428/473.5
(58) Field of Search ................... 428/458, 473.5, 428/213, 214, 215, 216

(56) References Cited

U.S. PATENT DOCUMENTS 5,360,671 * 11/1994 Harris ........................... 428/473.5
5,830,564 * 11/1998 Kohno et al. .................. 428/220
5,849,397 * 12/1998 Kohno et al. .................. 428/209

* cited by examiner

Primary Examiner—D. S. Nakarani
(74) Attorney, Agent, or Firm—Reed Smith LLP

(57) ABSTRACT

A polyimide composite film favorably employable for preparing a heat-resistant metal foil/polyimide film composite is composed of a polyimide substrate showing a thermal expansion coefficient of $1 \times 10^{-5}$ to $2 \times 10^{-5}$ cm/° C. in a temperature range of 50 to 200° C. and a polyimide film which is bonded to the substrate and which is made of polyimide composed of 30–100 molar % of the recurring unit (A) and 70–0 molar % of the recurring unit (B):

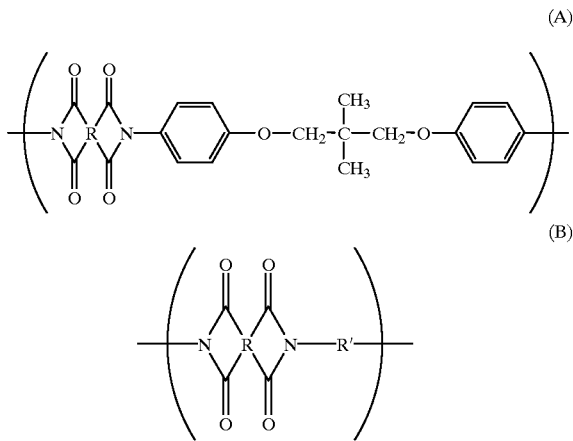

[each of R and R' is a tetravalent aromatic or aliphatic group].

7 Claims, No Drawings

POLYIMIDE COMPOSITE FILM

FIELD OF THE INVENTION

This invention relates a polyimide composite film favorably employable for preparing a heat-resistant metal foil/polyimide film composite.

BACKGROUND OF THE INVENTION

An aromatic polyimide film shows a high heat resistance as well as good electric characteristics, and is widely employed as material for electronic devices such as an electronic camera, a personal computer, and a liquid crystal display. For instance, the aromatic polyimide film is bonded to a copper foil via an adhesive such as an epoxy resin to produce a flexible printed circuit (FPC) or a substrate for tape automated bonding (TAB). Although the aromatic polyimide film is highly heat resistant, the conventional adhesive such as an epoxy resin has poor heat resistance. Accordingly, it is a problem that the produced copper foil/adhesive/polyimide film composite does not show satisfactory heat resistance.

In order to produce a copper foil/polyimide film composite having a high heat resistance, a number of improvements have been proposed. For instance, a copper metal is electrolytically plated on a polyimide film having no adhesive layer; a polyamide acid solution is coated on a copper foil, dried and heated to imidize the coated polyamide acid; or a thermoplastic polyimide is bonded to a copper foil by thermocompression.

U.S. Pat. No. 4,543,295 describes a polyimide composite (laminate) which is produced by bonding a polyimide film to a metal foil via a polyimide adhesive.

According to studies of the present inventors, however, the bonding strength of a polyimide composite produced by the above-mentioned process is not high.

Japanese Patent Provisional Publications H4-33847 and H4-33848 describe a method of bonding a multi-layered aromatic polyimide film to a metal foil by thermocompression. This process appears to be disadvantageous in that it requires a considerably high temperature and a high pressure for the thermocompression procedure. In particular, a temperature of higher than 300° C. is required in a continuous process for firmly bonding a multi-layered polyimide film to a metal foil. Such a high temperature is disadvantageous because the continuous process generally employs a rubber roller which is not high in heat resistance.

Therefore, most of these known processes are not appropriately employable for continuously producing a metal foil/polyimide film composite in a long term operation.

SUMMARY OF THE INVENTION

It is an object of the present invention to provide an aromatic polyimide composite film which can be firmly bonded to a metal foil at a relatively low temperature such as a temperature in the range of 230 to 280° C.

It is another object of the invention to provide a metal foil/aromatic polyimide film composite which has both a high heat resistance and a high bonding strength.

It is a further object of the invention to provide a process for preparing an aromatic polyimide composite film which can be firmly bonded to a metal foil at a relatively low temperature.

It is a still further object of the invention to provide a process for preparing a metal foil/aromatic polyimide film composite which has both a high heat resistance and a high bonding strength.

This invention resides in a polyimide composite film which comprises a polyimide substrate showing such a low thermal expansion coefficient of $1 \times 10^{-5}$ to $2 \times 10^{-5}$ cm/cm/°C. in a temperature range of 50 to 200° C. and a polyimide film which is bonded to the polyimide substrate and which comprises a polyimide consisting essentially of 30 to 100 molar % of the following recurring unit (A) and 70 to 0 molar % of the following recurring unit (B):

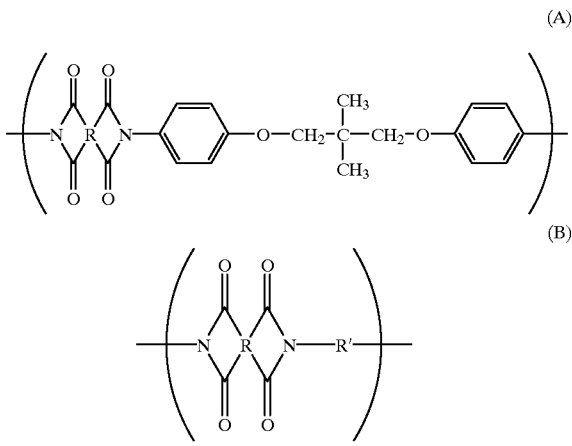

in which R represents a tetravalent aromatic or aliphatic group and R' represents a divalent aromatic or aliphatic group.

In the polyimide composite film of the invention, the polyimide substrate preferably comprises a polyimide consisting essentially of the following recurring unit:

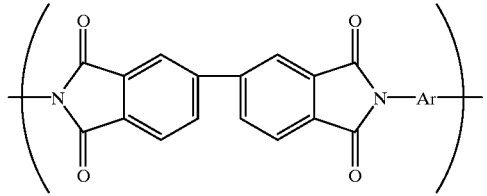

wherein Ar is a unit having the formula:

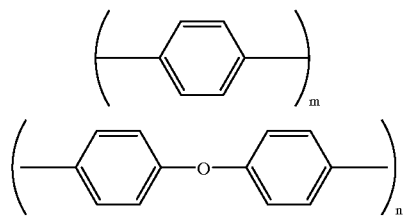

in which n/m is in the range of 0/100 to 30/70.

In the polyimide composite film of the invention, the polyimide film is preferably bonded to the polyimide substrate at a bonding strength of higher than 1.3 kg/cm, which is expressed in terms of 90° peel strength. The bonding strength of higher than 1.5 kg/cm is more preferred. The polyimide substrate preferably has a thickness in the range of 5 to 150 μm and the polyimide coating film preferably has a thickness in the range of 2 to 20 μm.

The invention further resides in a metal foil/polyimide film composite which comprises a polyimide substrate showing a thermal expansion coefficient of $1 \times 10^{-5}$ to $2 \times 10^{-5}$ cm/cm/° C. in a temperature range of 50 to 200° C., a polyimide film which is bonded to the polyimide substrate and which comprises a polyimide consisting essentially of 30 to 100 molar % of the aforementioned recurring unit (A) and 70 to 0 molar % of the aforementioned recurring unit (B).

In the metal foil/polyimide film composite of the invention, the polyimide film is preferably bonded to the polyimide substrate at a bonding strength of higher than 1.5 kg/cm in terms of 90° peel strength and the metal foil is preferably bonded to the polyimide film at a bonding strength of higher than 1.0 kg/cm, more preferably 1.3 kg/cm, in terms of 90° peel strength.

The invention further resides in a polyimide film comprising a polyimide consisting essentially of 30 to 100 molar % of the aforementioned recurring unit (A) and 70 to 0 molar % of the aforementioned recurring unit (B).

The invention furthermore resides in a process for preparing a polyimide composite film of the invention, which comprises the steps of:

coating a solution of a polyamide acid which gives a polyimide consisting essentially of 30 to 100 molar % of the aforementioned recurring unit (A) and 70 to 0 molar % of the aforementioned recurring unit (B), on a film of a polyamide acid which gives a polyimide substrate showing a thermal expansion coefficient of $1 \times 10^{-5}$ to $2 \times 10^{-5}$ cm/cm/° C. in a temperature range of 50 to 200° C.; and heating the polyamide acid film and the coated polyamide acid solution together to give a polyimide composite film.

Furthermore, the invention resides in a process for preparing a metal foil/polyimide film composite of the invention which comprises the steps of:

coating a solution of a polyamide acid which gives a polyimide consisting essentially of 30 to 100 molar % of the aforementioned recurring unit (A) and 70 to 0 molar % of the aforementioned recurring unit (B), on a film of a polyamide acid which gives a polyimide substrate showing a thermal expansion coefficient of $1 \times 10^{-5}$ to $2 \times 10^{-5}$ cm/cm/° C. in a temperature range of 50 to 200 C.;

heating the polyamide acid film and the coated polyamide acid solution together to give a polyimide composite film;

placing a metal foil on the polyimide film prepared from the coated polyamide acid solution; and bonding the metal foil to the polyimide film by a hot melt method.

DETAILED DESCRIPTION OF THE INVENTION

The polyimide substrate of the polyimide composite film of the invention is made of an aromatic polyimide having a thermal expansion coefficient of $1 \times 10^{-5}$ to $2 \times 10^{-5}$ cm/cm/° C. in a temperature range of 50 to 200° C. Such aromatic polyimide can be an aromatic polyimide prepared from a combination of 3,4,3',4'-biphenyltetracarboxylic dianhydride (hereinafter referred to as s-BPDA) and p-phenylenediamine (hereinafter referred to as PPD), or an aromatic polyimide prepared from a combination of pyromellitic dianhydride/3,4,3',4'-biphenyltetracarbonic dianhydride (or/benzophenonetetracarboxylic dianhydride) and p-phenylenediamine or p-phenylenediamine/4,4'-diaminodiphenyl ether (hereinafter referred to as DADE). In the case of using a combination of PPD and DADE, a molar ratio of DADE/PPD preferably is in the range of 0/100 to 85/15. The polyimide of the polyimide substrate can be prepared by random polymerization or block polymerization. Otherwise, the polyimide can be prepared by preparing two types of polyamide acids separately, mixing these two polyamide acids, and heating the mixture for imidization.

The polyimide substrate having a thermal expansion coefficient of $1 \times 10^{-5}$ to $2 \times 10^{-5}$ cm/cm/° C. in a temperature range of 50 to 200° C. shows a high bonding strength and a high dimensional stability, when it is bonded to a metal foil. Therefore, a metal foil/polyimide film composite of the invention shows a high peel resistance even in the etching procedure as well as in the generally applied soldering procedure.

The polyimide for the polyimide substrate can be prepared by reacting the diamine component and the tetracarboxylic dianhydride in an organic solvent in essentially equimolar amounts to give a polyamide acid solution (a portion of the polyamide acid may be already converted into a polyimide, provided that the polyamide acid solution is in the form of a homogeneous solution), and casting and heating the polyamide acid solution to give a polyimide film by imidization. In the preparation of a polyimide, other aromatic tetracarboxylic acid dianhydrides such as bis(3,4-dicarboxyphenyl)ether dianhydride, and other aromatic diamines such as 4,4'-diamino-diphenylmethane can be additionally employed, under the condition that the addition does not give any adverse influence on the resulting polyimide.

The polyimide to be coated on the polyimide substrate can be prepared by reacting 1,3-bis(4-aminophenoxy) -2,2-dimethylpropane (hereinafter referred to as DANPG) with bis(3,4-dicarboxyphenyl)ether dianhydride (hereinafter referred to as ODPA). ODPA may be replaced with 2,3,3',4'-biphenyltetracarboxylic dianhydride (hereinafter referred to as a-BPDA) or dianhydride of a mixture of ODPA and a-BPDA. Other diamine components and other tetracarboxylic dianhydride may be used in combination with DANPG and ODPA or a-BPDA, respectively.

The polyimide film for coating can be prepared by the steps of reacting the tetracarboxylic dianhydride and the diamine in an organic solvent at a temperature of approximately lower than 100° C., preferably in the range of 20 to 60° C., to give a polyamide acid solution, forming a thin solution film of the polyamide acid solution, evaporating the solvent from the solution film, and imidizing the polyamide acid (forming a cyclic imide).

Alternatively, the polyamide acid solution can be heated at a temperature of 150 to 250° C. for imidization. The imidization can be also performed by heating the polyamide acid solution at a temperature of lower than 150° C., preferably 15 to 50° C., after a chemical imidization reagent is incorporated. From the solution of thus imidized compound (i.e., polyimide), the solvent is evaporated to give a powdery polyimide. Otherwise, the polyimide solution is poured into a bad solvent to deposit a powdery polyimide out. The powdery polyimide is then dissolved in an organic solvent to give a polyimide film or simply dried to give a dry polyimide powder.

The polyimide for coating is preferably prepared using ODPA, a-BPDA, or their combination, as the tetracarboxylic acid dianhydride. However, other aromatic tetracarboxylic dianhydrides such as pyromellitic dianhydride, 3,3',4,4'-benzophenonetetracarboxylic dianhydride, 3,3',4,4'-biphenyltetracarboxylic dianhydride, 2,2-bis(3,4- dicarboxyphenyl)propane dianhydride, bis(3,4-dicarboxyphenyl)sulfone dianhydride, or 2,3,6,7-naphthalenetetracarboxylic dianhydride, particularly, 3,3',4,4'-biphenyltetracarboxylic dianhydride, can be employed in combination, under the condition that the other aromatic tetracarboxylic acids are employed in an amount of less than 20 molar %, specifically in an amount of less than 10 molar %.

The polyimide for coating is prepared using a diamine component comprising at least 30 molar % of the aforementioned DANPG. 1,3 -Bis(4-aminophenoxy)benzene can be employed in combination in an amount of less than 70 molar %. Thus combined amine components are favorably employed for enhancing the heat resistance (e. g., thermal decomposition temperature), as compared with the single use of DANPG. Other diamine components can be employed in combination with the above-mentioned diamine components in an amount of less than 20 molar %, preferably less than 10 molar %. Examples of the diamine components employable in combination include flexible aromatic diamine having plural benzene rings such as 4,4-diaminodiphenyl ether, 4,4'-diaminodiphenyl sulfide, 4,4'-diaminobenzophenone, 4,4'-diaminodiphenylmethane, 2,2-bis-(4-aminophenyl)propane, 1,4-bis(4-aminophenoxy)benzene, 4,4'-bis(4-aminophenyl)diphenyl ether, 4,4'-bis(4-amino-phenyl)diphenyl sulfide, 4,4'-bis(4-aminophenyl)diphenylmethane, 4,4'-bis(4-aminophenoxy)diphenyl sulfone, 4,4'-bis (4-aminophenoxy)diphenyl sulfide, 4,4'-bis (4-amino-phenoxy)diphenylmethane, 2,2-bis[4-(aminophenoxy)phenyl]-propane, and 2,2-bis[4-(4-aminophenoxy)phenyl]hexafluoropropane; aliphatic diamines such as 1,4-diaminobutane, 1,6-diaminohexane, 1,8-diaminooctane, 1,10-diaminodecane and 1,12-diaminododecane; and other diamines such as xylenediamine. The flexible aromatic diamine having plural benzene rings can be employed in an amount of less than 20 molar %, preferably less than 10 molar %, based on the total diamine content. The aliphatic diamine can be employed in an amount of less than 20 molar %, based on the total diamine content. If the additional diamine component is employed in an amount of more than the upper limit, the heat resistance of the resulting polyimide for coating lowers.

The polyimide for coating can be prepared using the aforementioned diamine component preferably in a molar ratio of 0.92 to 1.0 (particularly, 0.98 to 1.0, more particularly 0.99 to 1.0) per the total moles of the acid dianhydride. This molar ratio is calculated based on the molar amount of amino groups and the molar amount of acid dianhydride groups. The acid anhydride generally comprises tetracarboxylic dianhydride and dicarboxylic dianhydride. The amount of the latter dianhydride preferably is less than 5 molar, more preferably in an amount of 0.01 to 2 molar %.

The polyimide for coating preferably has a capped amine terminal or a free acid terminal. The amine terminal can be capped with dicarboxylic dianhydride such as phthalic dianhydride, its derivatives, hexahydrophthalic dianhydride, its derivatives, succinic dianhydride, or its derivatives. Phthalic dianhydride is most favorably employed. A tetra-acid which is produced by hydrolysis of the aforementioned aromatic tetracarboxylic dianhydride is also favorably employed.

If the polyimide for coating is prepared using the aforementioned diamine and dicarboxylic anhydride in amounts of other than the aforementioned ranges, it likely has a smaller molecular weight and shows poor film strength and low peel strength. Particularly, if the diamine component is employed in an excessive amount (under the condition that the amine terminal is not capped), the resulting polyimide likely suffers damage in the course of imidization of the polyamide acid or in the course of evaporation of the solvent, and hence shows poor film characteristics and low peel strength.

In the polyamide acid solution for the preparation of the polyimide for coating, a phosphoric stabilizer such as triphenyl phosphite or triphenyl phosphate can be placed in an amount of 0.01 to 1% (per the solid content, namely, the polymer content, of the solution) for keeping the polyamide acid solution from gelation in the heat processing.

In the polyamide acid solution, an organic base compound such as imidazole, 2-methylimidazole, 1,2-dimethylimidazole, 2-phenylimidazole or triethylamine can be placed in an amount of 0.1 to 10 weight % (based on the amount of the solid content in the polyamide acid solution) for accelerating the imidization reaction. The organic base compound is preferably employed when the imidization reaction is performed at a relatively low temperature, because the imidization reaction at a low temperature sometimes results in the formation of poorly imidized polymer.

In the polyamide acid solution, an organic or inorganic aluminum compound such as aluminum triacetylacetonate or aluminum hydroxide can be placed in an amount of 1 to 1,000 ppm (based on the amount of solid content in the polyamide acid solution) for improving the thermocompression property of the resulting polyimide film.

Examples of the organic solvents employable for preparing the aforementioned polyamide acid solution (for the production of polyimides for the polyimide substrate and polyimide coating) include N-methyl-2-pyrrolidone, N,N-dimethylformamide, N,N-dimethylacetamide, N,N-diethylacetamide, dimethylsulfoxide, hexamethylphosphoramide, and N-methylcaprolactam. The organic solvents can be employed singly or in combination.

The polyimide substrate of the polyimide composite film of the invention can be produced by preparing a clear polyamide acid solution in accordance with the formulation designed for the preparation of the polyimide substrate, spreading the polyamide acid solution on a temporary support such as a glass plate, a stainless mirror plate, or a continuous belt to form a solution film, and heating the solution film at a temperature of 100 to 200° C. to dryness for converting the solution film into a semi-hardened film. If the solution film is heated to a temperature of higher than 200° C. in the last step, the resulting polyimide composite film likely shows poor adhesion. The term of "semi-hardened film" is used to mean such film that it is partly gelated by heat treatment, optionally, in the presence of a chemical imidizing agent, to turn into a self-supporting film.

On one surface or both surfaces of the semi-hardened polyamide acid film (or partly imidized polyamide acid film) is coated a polyamide acid solution (or a polyimide solution) formulated for the preparation of the polyimide coating. Thus coated film is then heated to a temperature of lower than 400° C., preferably to a temperature in the range of 270 to 370° C., preferably for a period of 1 to 60 minutes, for drying the coated film and imidizing the polyamide acid portion to give the desired polyimide composite film. The heating temperature should be higher than the glass transition temperature (Tg) of the polyimide for coating, but lower than the decomposition temperature of the polyimide for coating.

Alternatively, the polyamide acid solution for the preparation of the polyimide substrate and the polyamide acid solution or polyimide solution for the preparation of the polyimide coating can be co-extruded in the manner as described in Japanese Patent Provisional Publication No. H4-33847 to give a multi-layered polyimide composite film having a two or three layer structure.

The polyimide composite film can be bonded under pressure to a metal foil by a hot melt method under such condition that the coated polyimide film is brought into contact with the metal foil. Two metal foils can be bonded to the polyimide composite film, if the composite film has a coated polyimide film on both sides of the polyimide substrate. The bonding procedure can be performed preferably at a temperature of 230 to 280° C. and a pressure of 1 to 100 kgf/cm$^2$, for 1 to 60 seconds.

A continuous polyimide film/metal foil composite can be produced from the polyimide composite film and a metal foil by a hot-melt method, by means of a set of heating rollers (at least some of the rollers are preferably made of elastic material).

In the polyimide composite film of the invention, the polyimide substrate film preferably has a thickness in the range of 5 to 150 μm. If the thickness is less than 5 μm, the polyimide composite film likely shows unsatisfactory mechanical strength and poor dimensional stability. It is difficult to produce a uniform polyimide film having a thickness of larger than 150 μm because it is not easy to imidize uniformly a polyamide acid in the form of a thick film.

The polyimide coating of the polyimide composite film of the invention preferably has a thickness in the range of 0.5 to 25 μm, more preferably 2 to 20 μm. If the thickness is smaller than the lower limit, the adhesion is poor. A coated polyimide film having a too larger thickness shows no advantageous feature and sometimes gives adverse effect to the heat resistance of the resulting polyimide film/metal foil composite.

Therefore, the polyimide substrate has a thickness of preferably 25% or more, more preferably 60% or more, of the total thickness of the polyimide composite film. If the ratio of thickness of the polyimide substrate is less than 25%, the resulting polyimide composite film likely shows a low mechanical strength and low dimensional stability.

In the polyimide film/metal foil composite of the invention, the metal foil may comprise single metal or alloy. The metal foil can be a foil or film of copper, aluminum, gold, silver, nickel, stainless steel, or a silicate metal. Otherwise, the metal foil is a plated metal film. Preferred are rolled copper foil and electrolytic copper foil. The metal foil preferably has a thickness in the range of 0.1 μm to 10 mm, more preferably 5 to 60 μm.

As is described hereinbefore, the polyimide composite film of the invention comprises a combination of a specifically selected polyimide substrate and one or two specifically selected polyimide coating films, in which the polyimide substrate and the polyimide coating film(s) are bonded to each other at a high bonding strength. The high bonding strength of the polyimide composite film of the invention is observed in the form of a polyimide film/metal foil composite in a test using a solder bath. Particularly preferred is that the polyimide composite film of the invention can be prepared by thermocompression at a relatively low temperature. Accordingly, the polyimide composite film of the invention and the polyimide film/metal foil composite, both of which are according to the invention, show a high mechanical strength as well as a high heat resistance, which are favorably accepted in industries for manufacturing various electronic materials as well as various electric materials.

The present invention is further described by the following examples.

Preparation of Polyamide Acid Solution (Dope X) for Producing Polyimide Substrate In a 300 mL-volume glass reaction vessel equipped with a stirrer, a nitrogen gas inlet and a reflux condenser was placed 183 g of N,N-dimethylacetamide (DMAc). DMAc was stirred, and to the stirred DMAc was added 10.81 g (0.1000 mol.) of p-phenylenediamine (PPD) in a stream of a nitrogen gas. The mixture was kept at 50° C. under stirring until it turns into a complete solution. To the solution was potionwise added 29.229 g (0.09935 mol.) of 3,3',4,4'-biphenyltetracarboxylic dianhydride (s-BPDA), keeping exothermic reaction low. The resulting mixture was kept at 50° C. for 5 hours after the addition was complete. In the reaction mixture, 0.2381 g (0.00065 mol.) of 3,3',4,4'-biphenyltetracarboxylic dianhydride (s-BPDA) was placed and dissolved. The resulting polyamide acid solution was a viscous brown liquid having a solution viscosity (at 25° C.) of approximately 1,500 poises. This solution was named Dope X.

A portion of Dope X was processed to give a polyimide film of 25 μm thick which showed a thermal expansion coefficient of 1.7×10$^{-5}$ cm/cm/° C. (in the temperature range of 50 to 200° C). The thermal expansion coefficient was measured at a temperature elevation rate of 10° C./min.

Preparation of Polyamide Acid Solution (Dope Y-1) for Producing Polyimide Coating In a 500 mL-volume glass reaction vessel equipped with a stirrer, a thermometer, a nitrogen gas inlet and a fractionating column having a reflux condenser was placed 239 g of DMAc. DMAc was stirred, and to the stirred DMAc were added 28.644 g (0.1000 mol.) of 1,3-bis(4-aminophenoxy)-2,2-dimethylpropane (DANPG), 1.78 g of 2-methylimidazole (2MZ) and 0.6 mg of aluminum hydroxide in a stream of a nitrogen gas. The mixture was kept at 30° C. under stirring until it turns into a complete solution. To the solution was potionwise added 30.90 g (0.09960 mol.) of bis(3,4-dicarboxyphenyl) ether dianhydride (ODPA), keeping exothermic reaction low. The resulting mixture was kept at 30° C. for 5 hours after the addition was complete. In the reaction mixture, 0.330 g (0.0009 mol.) of s-BPDA was placed and dissolved. In the solution, the ratio of the diamine components and the acid components was 1:1.005 (molar ratio). The resulting polyamide acid solution was a viscous brown liquid having a solution viscosity (at 25° C.) of approximately 1,500 poises. This solution was named Dope Y-1.

Preparation of Polyamide Acid Solution (Dope Y-2) for Producing Polyimide Coating The procedures for preparing Dope Y-1 were repeated except for replacing 239 g pf DMAc, 1.78 g of 2 MZ, 30.90 g (0.09960 mol.) of ODPA, and 0.330 g (0.0009 mol.) of s-BPDA, respectively, with 232 g of DMAc, 1.74 g of 2 MZ, 29.38 g (0.09985 mol) of a-BPDA, and 0.238 g (0.00065 mol.) of s-BPDA. The resulting polyamide acid solution was a viscous brown liquid having a solution viscosity (at 25° C.) of approximately 1,500 poises. This solution was named Dope Y-2.

Preparation of Polyamide Acid Solution (Dope Y-3) for Producing Polyimide Coating The procedures for preparing Dope Y-1 were repeated except for replacing 239 g of DMAc, 28.64 g (0.10000 mol.) of DANPG, 30.90 g (0.09960 mol.) of ODPA, and 0.330 g (0.0009 mol.) of s-BPTA, respectively, with 239 g of DMAc, a combination of 14.32 g (0.050000 mol.) of DANPG and 14.61 g (0.05000 mol.) of 1,3-bis(4-aminophenoxy)benzene (TPE-R), 30.88 g (0.09955 mol.) of ODPA, and 0.348 g (0.00095 mol.) of s-BPTA. The resulting polyamide acid solution was a viscous brown liquid having a solution viscosity (at 25° C.) of approximately 1,500 poises. This solution was named Dope Y-3.

EXAMPLE 1

Dope X was spread on a glass plate using an applicator and heated to 120° C. for 15 minutes to give a dry film. On the dry film was coated Dope Y-1 using an applicator and heated to 120° C. for 15 minutes to give a dry coating film.

The two-layer film was once cooled and separated from the glass plate. The separated film was fixed to a stainless steel frame, and heated at 200° C. for 5 minutes, at 250° C. for 5 minutes, and at 350° C. for 3 minutes, to give a two layer polyimide composite film (total thickness: 32 µm, substrate thickness: 25 µm, coat thickness: 7 µm). On the polyimide composite film was placed an electrolytic copper foil (3EC-3, produced by Mitsui Metal Minning Co., Ltd.) of 35 µm thick in such manner that the copper foil was placed in contact with the coating polyimide layer of the composite film. The combined copper foil/polyimide film was placed in a hot press heated to 240° C. for 5 minutes (pre-heating) and pressed at a pressure of 30 kgf/cm² for 1 min., to give a copper foil/polyimide film composite. There was almost no curling on the produced copper foil/polyimide film composite.

The produced copper foil/polyimide film composite was subjected to measurement of 90° peel strength under the following conditions:

(1) with no treatment;

(2) after etching copper foil (line-and-space at spaces of 1 mm);

(3) after dipping the composite in a solder bath (kept at 280° C.) for 1 minute.

The appearance of the composite film dipped in the solder bath was also observed.

The results are set forth in Table 1. The separation observed occurred on an interface between the copper foil and the polyimide coating film.

EXAMPLES 2 & 3

The procedures of Example 1 were repeated using a combination of Dope X and Dope Y-2 (for Example 2) or a combination of Dope X and Dope Y-3 (for Example 3), to give a two layer polyimide composite film for each Examples.

The each polyimide composite film was bonded to a copper foil in the manner described in Example 1, except for varying the temperature for the pressing procedure. There was almost no curling on the produced copper foil/polyimide film composite.

The produced copper foil/polyimide film composite was evaluated in the manner as described in Example 1. The results are also set forth in Table 1. The separation observed occurred on an interface between the copper foil and the polyimide coating film.

TABLE 1

| Polyimide substrate/coat film | 90° peel strength (kgf/cm) | | | Appearance after Soldering | Temperature of thermo-compression |
|---|---|---|---|---|---|
| | (1) | (2) | (3) | | |
| Ex. 1 | X/Y-1 | 1.4 | 1.4 | 1.4 | good | 240° C. |
| Ex. 2 | X/Y-2 | 1.3 | 1.3 | 1.3 | good | 270° C. |
| Ex. 3 | X/Y-2 | 1.5 | 1.5 | 1.5 | good | 250° C. |

Remarks: The polyimide prepared from Dope X gave no clear glass transition temperature between room temperature and 350° C. The polyimides prepared from Dopes Y-1, Y-2 and Y-3 gave glass transition temperatures of 219° C., 248° C. and 220° C., respectively.

COMPARISON EXAMPLE 1

Dope Y-1 was coated on a commercially available polyimide film (Upilex-S, available from Ube Industries, Ltd., thickness: 25 µm) using an applicator, and heated at 120° C. for 15 minutes, at 200° C. for 5 minutes, and at 350° C. for 3 minutes. The coated polyimide film had a thickness of 7 µm. Accordingly, the total thickness of the resulting two layer polyimide composite film was 32 µm.

The polyimide composite film was then combined to an electrolytic copper foil in the manner as described in Example 1. The resulting copper foil/polyimide film composite had a so small bonding strength such as 0.5 kgf/cm. Therefore, the resulting copper foil/polyimide film composite was not employable in industrial uses.

Further, it was observed that the coated polyimide film was separated from the substrate film (Upilex-S) when the bonding strength was measured.

EXAMPLE 4

In the same manner as that in the preparation of Dope X, s-BPDA and PPD were reacted in DMAc to give a polyamide acid solution (Dope X-1) having a polymer content of 18 weight % and a solution viscosity of 1,500 poises.

In the same manner as that in the preparation of Dope Y-1, ODPA, DANPG and TPER (100:50:50) were reacted in DMAc to give a polyamide acid solution (Dope Y-4) having a polymer content of 20 weight % and a solution viscosity of 1,500 poises. Then, a releasing agent (Sepal 365, available from Chukyo Oil and Fat Industry, Co. , Ltd.) was incorporated into Dope Y-4 in an amount of 0.25% based on the polymer content.

One portion of Dope X-1 and two portions of Dope Y-4 were simultaneously extruded onto a metal support having a smooth surface from a die for forming three layer solution films in the manner as described in Japanese Patent Provisional Publication H4-33847, and then heated continuously by applying to the surface of the solution films air heated to 140° C., to give a solid composite film. The solid composite film was separated from the support and heated in a heating furnace by increasing the temperature from 180° C. to 350° C. for removing the solvent and accelerating imidization reaction. There was produced a continuous three layer polyimide composite film having thicknesses of 4.0 µm/17.0 µm/4.0 µm.

On both sides of the continuous polyimide composite film was placed an electrolytic copper foil (3EC-VLP, produced by Mitsui Metal Minning Co., Ltd.) of 18 µm thick in the manner as described in Japanese Patent Provisional publication No. H4-33847. The combined polyimide composite film/copper foil was pressed at a temperature of 270° C. (temperature of heated roller) and a pressure (roller pressure) of 24 kg/cm, under running the continuous comined polyimide composite film/copper foil at a rate of 1 m/min, to give a continuous polyimide film/copper foil composite. No curling was observed on the produced continuous polyimide film/copper foil composite.

The continuous composite was measured on its bonding strength by 90° peel test. The metal foil bonded to each surface (i.e., the surface exposed to hot air and the surface placed in contact with the support) of the polyimide composite film showed a bonding strength of 1.3 kgf/cm. The separation occured between the copper foil and the polyimide film. The bonding strength did not vary after the etching treatment and the soldering. In each case, the separation also occured between the copper foil and the polyimide film.

The polyimide film/copper foil composite was processed by etching to remove whole copper portion and measured for dimensional stability in the course of the etching treatment. The dimensional variation was +0.04% in the MD direction and −0.03% in the TD direction. Thus, satisfactorily low dimensional variation was confirmed.

What is claimed is:

1. A polyimide composite film which comprises a polyimide substrate showing a thermal expansion coefficient of $1\times10^{-5}$ to $2\times10^{-5}$ cm/cm/° C. in a temperature range of 50 to 200° C. and a polyimide film which is bonded to the polyimide substrate and which comprises a polyimide consisting essentially of 30 to 100 molar % of the following recurring unit (A) and 70 to 0 molar % of the following recurring unit (B):

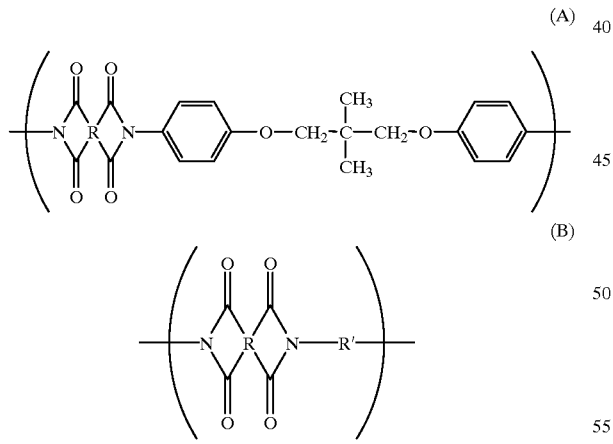

in which R represents a tetravalent aromatic or aliphatic group and R' represents a divalent aromatic or aliphatic group wherein the polyimide film is bonded to the polyimide substrate at a bonding strength of higher than 1.3 kg/cm in terms of 90° peel strength.

2. The polyimide composite film of claim 1, wherein the polyimide substrate comprises a polyimide consisting essentially of the following recurring unit:

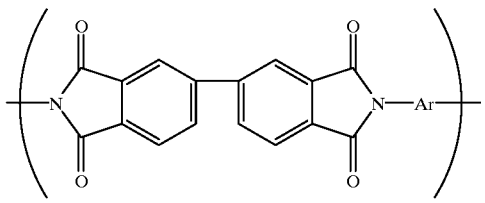

wherein Ar is a unit having the formula:

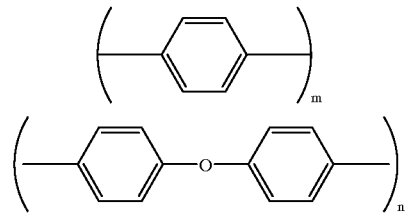

in which n/m is in the range of 0/100 to 30/70.

3. The polyimide composite film of claim 1, wherein the polyimide substrate has a thickness in the range of 5 to 150 μm and the polyimide film has a thickness in the range of 2 to 20 μm.

4. A metal foil/polyimide film composite which comprises a polyimide substrate showing a thermal expansion coefficient of $1\times10^{-5}$ to $2\times10^{-5}$ cm/cm/° C. in a temperature range of 50 to 200° C. and a polyimide film which is bonded to the polyimide substrate and which comprises a polyimide consisting essentially of 30 to 100 molar % of the following recurring unit (A) and 70 to 0 molar % of the following recurring unit (B):

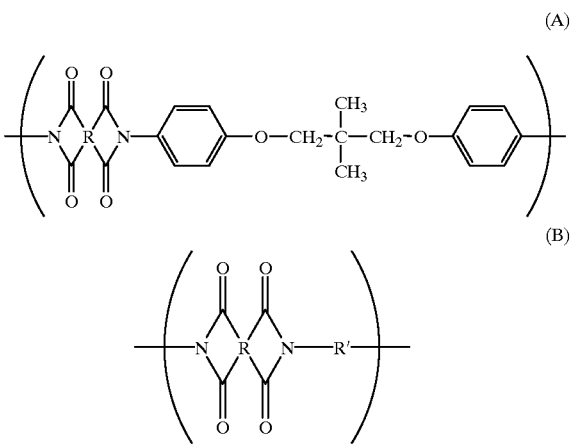

in which R represents a tetravalent aromatic or aliphatic group and R' represents a divalent aromatic or aliphatic group, and a metal foil bonded to the polyimide film wherein the polyimide film is bonded to the polyimide substrate at a bonding strength of higher than 1.3 kg/cm in terms of 90° peel strength.

5. The metal foil/polyimide film composite of claim 4, wherein the polyimide substrate comprises a polyimide consisting essentially of the following recurring unit:

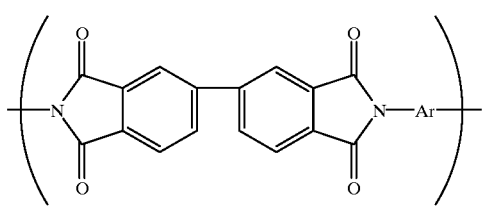

wherein Ar is a unit having the formula:

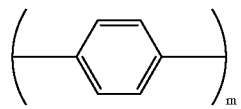

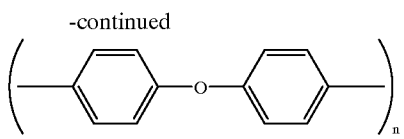

in which n/m is in the range of 0/100 to 30/70.

6. The metal foil/polyimide film composite of claim 4, wherein the metal foil is bonded to the polyimide film at a bonding strength of higher than 1.0 kg/cm in terms of 90° peel strength.

7. The metal foil/polyimide film composite of claim 4, wherein the polyimide substrate has a thickness in the range of 5 to 150 μm and the polyimide film has a thickness in the range of 2 to 20 μm.

* * * * *